United States Patent [19]

Onuki et al.

[11] Patent Number: 5,051,812
[45] Date of Patent: Sep. 24, 1991

[54] SEMICONDUCTOR DEVICE AND METHOD FOR MANUFACTURING THE SAME

[75] Inventors: Jin Onuki; Masayasu Nihei, both of Hitachi; Yasushi Koubuchi, Kodaira; Motoo Suwa; Shinichi Fukada, both of Hitachi; Katsuhiko Shiota, Tohkai; Kunio Miyazaki, Hitachi; Tatsuo Itagaki, Hinode; Jun Sugiura, Musashino, all of Japan

[73] Assignee: Hitachi, Ltd., Tokyo, Japan

[21] Appl. No.: 551,852

[22] Filed: Jul. 12, 1990

[30] Foreign Application Priority Data

Jul. 14, 1989 [JP] Japan .................. 1-180348

[51] Int. Cl.$^5$ .................. H01L 29/46; H01L 23/54
[52] U.S. Cl. .................. 357/71; 357/67
[58] Field of Search .................. 357/71, 80, 67, 70

[56] References Cited

U.S. PATENT DOCUMENTS

| | | | |
|---|---|---|---|
| 4,543,592 | 9/1985 | Itsumi et al. | 357/71 |
| 4,556,897 | 12/1985 | Yorikane et al. | 357/67 |
| 4,582,563 | 4/1986 | Hazuki et al. | 357/71 |
| 4,862,243 | 8/1989 | Welch et al. | 357/71 |
| 4,948,755 | 8/1990 | Mo | 357/71 |

Primary Examiner—Rolf Hille
Assistant Examiner—S. V. Clark
Attorney, Agent, or Firm—Antonelli, Terry, Stout & Kraus

[57] ABSTRACT

A semiconductor device having a high reliability wiring conductor structure applicable to DRAMs and SRAMs.

The semiconductor device of the present invention is characterized by comprising a first wiring conductor film wherein a specific resistance is $5 \sim 15 \mu\Omega cm$ and an allowable current density is $1 \times 10^6 \sim 1 \times 10^8$ A/cm$^2$; a second wiring conductor film having a laminated layer structure formed of a layer of high fusing point and low resistance material and a layer of an Al based alloy; and a plug composed of a high fusing point and low resistance material, electrically connecting to the first wiring conductor film and the second wiring conductor film. Thus, a semiconductor device showing almost no increase in electrical resistance in a wiring conductor film due to electromigration even after subjecting to a large current is provided.

20 Claims, 9 Drawing Sheets

COVERAGE : $\frac{t}{T} \times 100$ (%)

RELATIONSHIP BETWEEN STEP COVERAGE AND BIAS VOLTAGE

ELECTROMIGRATION RESISTANCE OF EACH METALLIZATION SYSTEM

SEMICONDUCTOR DEVICE AND METHOD FOR MANUFACTURING THE SAME

BACKGROUND OF THE INVENTION (a) Field of the Invention

The present invention relates to a semiconductor device and a method for manufacturing the same, and more particularly to a semiconductor device having a highly reliable wiring conductor film and a method for manufacturing the same.

(b) Description of the Prior Art

As conventional wiring conductor film materials used in a semiconductor device, aluminum alloys doped with a small amount of copper, silicon or precious metals have been known.

A copper-doped aluminum conductive stripe is disclosed in U.S. Pat. No. 3,725,309, and is indicated to be advantageous against electromigration, in other words, to be effective in preventing disconnection failures in conductive film interconnections due to electrical drift.

According to the above U.S. Pat., in order to avoid the problems due to electromigration, copper (Cu) in an amount of 0.1 to 54 weight is added to aluminum (Al). Thereby precipitation structure of $CuAl_2$ grains is formed, the same interposes in grain boundaries and intercrystal triple points of aluminum base, restrains atom movement of aluminum atoms, and prolongs a life span of a semiconductor device while suppressing the electromigration.

However, as $CuAl_2$ is likely to segregate, so that there is a drawback that a failure due to electromigration occurs at portions where $CuAl_2$ is not precipitated.

Moreover, it is difficult to process an AlCu alloy into a conductive film pattern by means of dry-etching. As the same is corroded with chlorine (Cl) elements in use and residual Cl ions, the same is attended with a drawback in that it is extremely difficult to process the same with a precision of less than $1\mu m$, in particular less than $0.6 \mu m$.

Besides, a little amount of silicon and moreover a precious metal (Pt, Pd, Rh, In) doped aluminum conductor film material is disclosed in Japanese Patent Application, Laid-Open No. 60-26640 (1986), and Japanese Patent Application Laid-Open No. 61-144817 (1986), however the same is attended with the same drawback as in the above U.S. Pat.

Further, so as to enhance electromigration resistance property, a laminated wiring conductive film which is composed of an aluminum alloy and a high fusing point metal is discussed in IEEE, IRPS (1988) pp. 179–184.

This is because such prevents disconnection of the wiring conductor as a whole, due to the laminated high fusing point metal even when an aluminum alloy be disconnected due to electromigration.

More specifically, as laminated wiring conductor films having an aluminum alloy and a high fusing point metal, there are mentioned AlCu alloy/$MoSi_2$ and AlSi alloy/TiW. However, the specific resistance of $MoSi_2$ is about 800 $\mu\Omega cm$, that of TiW is 60–100 $\mu\Omega cm$, and these are about 20 to 300 times higher than that of an Al alloy (30 $\mu\Omega cm$). Therefore, when an Al alloy is disconnected, the temperature of $MoSi_2$ or TiW increases, causing another disconnection.

Moreover, the above laminated-layer conductor film permits a current density of only 1 to $2\times 10^2$ $A/cm^2$, which is not sufficient for a current density of more than $5\times 10^5$ $A/cm^2$ required for a semiconductor device incorporating a microscopic conductor film (less than 0.6 $\mu m$) to meet with ever increasing memory capacity.

In the above-mentioned prior art, measures for improving electromigration resistance in aluminum alloys and lowering electrical resistance in laminated conductor films were not examined sufficiently.

Resistance increase in the laminated conductor film due to electromigration results from disconnection at grain boundaries, which is caused by migration, or mass transport of aluminum over a layer of $MoSi_2$ or TiW (hereinafter referred to as a barrier layer) during current conduction. When grain boundaries are strong enough, an increase in resistance will not occur.

However, since the specific resistances of $MoSi_2$ and TiW are approximately 20 to 300 times larger than that of aluminum, when the electromigration resistance of aluminum is insufficient, the resistance of the conductor film will inevitably increase owing to the disconnection of aluminum, thereby leading to a disconnection of the laminated conductor film. Because the electromigration resistance property of an AlCu alloy now in use is not enough, the same has a problem wherein the resistance of the conductor film is increased through a large electric current conduction.

When aluminum alloys doped with several percent of silicon are used for wiring in a semiconductor device, and this device is operated under a large current or at a high temperature, constituent atoms in the aluminum alloy conductor film are migrated, due to a current flowing therein, forming a hillock in one section and a void in another section. When the hillock grows the same causes a short-circuiting, when the voids grows the same causes an electrical resistance increase in the wiring conductor, consequently fusing the same by the heat generated, finally leading to a failure of the semiconductor device.

Prior publications other than above relating to wiring conductor thin films, are Japan Patent Application, Laid-Open No. 55- 56645 (1980), Japan Patent Application, Laid-Open No. 59- 61147 (1984), Japan Patent Application, Laid-Open No. 59- 28360 (1984) Japan Patent Application, Laid-Open No. 63-4649 (1988), and Japan Patent Application, Laid-Open No. 133648 (1988).

SUMMARY OF THE INVENTION (a) Objects of the Invention

An object of the present invention is to provide a semiconductor device which has a high electromigration resistance than that of an Al-Si alloy/TiW now in use and thereby prevents the disconnection of the wiring conductor film.

Furthermore, an object of the present invention is to provide a semiconductor device wherein the resistance of the wiring conductor film is hardly increased due to electromigration even when a large electric current of more than $5\times 10^5$ $A/cm^2$ is conducted therethrough.

Moreover, an object of the present invention is to provide a semiconductor device and a method of manufacturing the same wherein a coverage of contact holes formed by means of a sputtering method is more than 30%.

(b) Statements of the Invention

A semiconductor device according to the present invention is comprising a semiconductor substrate; a first insulator film formed on the semiconductor substrate; a first wiring conductor film disposed on the first insulator film for interconnection, electrically connected to the semiconductor substrate through contact holes, having a specific resistance of 5 to 15 $\mu\Omega$cm, having an allowable current density of $1\times10^6$ to $1\times10^2$; a second insulator film formed on the first wiring conductor film; a plug composed of a refractory material and low resistance material filling a through hole made in the second insulator film with substantially the same thickness as the second insulator film, electrically connected to the first wiring conductor film; and a second wiring conductor film disposed on the second insulator film and the plug for interconnection, electrically connected to the plug, having a laminated layer structure of at least a layer of the refractory material and low resistance material.

For materials for the semiconductor substrate used in a semiconductor device according to the present invention, it is preferable to use Si (Silicon).

As materials for the first insulator film and the second insulator film, it is preferable to use metal oxides, and most preferably $SiO_2$.

As a material for the first wiring conductor film, such materials having a specific resistance of 5 to 15 $\mu\Omega$cm and an allowable current density of $1\times10^6$ to $1\times10^8$ $A/cm^2$ are to be used, in particular, W (tungsten), Mo (molybdenum) or TiN (titanium nitride) etc., are preferably to be used. The first wiring conductor film is required to have a durability to a stress from a first insulator film to be formed thereon. The first wiring conductor film, however, is not required to have as low an electrical resistance as that required for a second wiring conductor film to be overlaid later. Therefore it is preferable to use a metal having a high resistance to the stress and a high fusing point for the first siring conductor film. Thereby, disconnection due to a large electric current conduction is prevented.

The second wiring conductor film is preferably to have a laminated layer structure formed of a layer of a high fusing point and low resistance material and a layer of an aluminum based alloy. The laminated layer structure may be either one in which a layer of aluminum based alloys is laminated onto a layer of a high fusing point and low resistance material, or one in which a layer of a high fusing point and low resistance material is laminated onto a layer of aluminum based alloy. Furthermore the laminated layer structure may be one sandwiching a layer of an Al based alloy between layers of a high fusing point low resistance material. The high fusing point and low resistance layer is preferably made of the same material as that in the first wiring conductor film; more specifically, W, Mo, TiN, or the like is used. The aluminum based alloys are required to have a lower resistance than that of a high fusing point and low resistance layer. As aluminum based alloys, Al-Pd-Nb-Si, Al-Pd-Cr-Si, Al-Pd-Zr-Si, Al-Pd-Mo-Si, Al-Pd-Mg-Si, Al-Pd-Ta-Si and the like are preferable, in particular, Al-Pd-Nb-Si or Al-Pd-Nb without Si is preferable. Furthermore, a preferable alloy composition is such having 0.01 to 0.5 weight percent of Pd, 0.1 to 2 weight percent of Si, 0.01 to 5 weight percent of one of Nb, Cr, Zr, Mo, Mg, and Ta, and the remainder of aluminum. In addition, when W, Mo or TiN is used for a layer of a high fusing point and low resistance material, Al-Si, Al-Cu, Al-Si-Cu and the like may be used for a mating layer. Because of the laminated layer structure, the second wiring conductor film is required to have a higher current density than that required for the first wiring conductor film.

As the plug electrically connecting the first wiring conductor film with the second wiring conductor film, a high fusing point material, such as W, Mo and TiN is preferably used.

In the following, a method for manufacturing a semiconductor device in according with the present invention is explained. Steps of the manufacturing method comprise, (1) a step of forming a first insulator film on a semiconductor substrate, (2) a step of forming a contact hole in the first insulator film, (3) a step of forming a first wiring conductor film on the first insulator film, so as to connect electrically with the semiconductor substrate through the contact hole, (4) a step of forming a second insulator film on the first wiring conductor film, (5) a step of filming a through hole in the second insulator film, (6) a step of forming a plug by filling the through hole with substantially the same thickness as the second insulator in order to electrically connect thereof to the first wiring conductor film, and (7) A step of forming a second wiring conductor film on the second insulator film and the plug so as to electrically connect with the plug.

The first wiring conductor film is preferably formed by a sputtering method, wherein preferably a sputter voltage and a bias voltage are alternatively switched. Thereby, a film of tungsten (W) or others is formed on a contact hole with a coverage of more than 30%, and with a wiring conductor surface irregularity of less than 0.2 $\mu$m.

It is extremely difficult to form a layer of tungsten (W) or the like, with a good coverage, on the abovementioned contact hole by means of a usual sputtering method. An ordinary coverage was 10 to 20%. Besides, adhesion with a semiconductor substrate is inferior because of inclusion of impurities, etc.

In the present invention, a coverage more than 30% is obtained by setting a sputter pressure in a range of $10^{-4}$ Torr, and by alternatively applying sputter and bias voltages. In addition, high adhesion with a semiconductor substrate, in particular, a silicon substrate, is obtained.

Namely, when a sputter voltage is applied, sputtered tungsten (W) or the like is deposited on the bottom of a microscopic hole. Deposited tungsten on the bottom is then resputtered onto the wall by applying a bias voltage. Thereby the coverage is improved.

An effect of resputtering is confirmed in a vacuum of $10^{-4}$ Torr order. In an ordinary sputtering under vacuum of $10^{-3}$ Torr order, however, the effect of resputtering by argon (Ar) particles has not been sufficiently recognized. In addition, because this resputtering method helps to reduce the amount of inclusion of impurities in the wiring conductor film, a wiring conductor film with a small specific resistance is obtained.

Further, when forming the plug in the through hole, the plug may be formed either in the same way by a sputtering method as in the first wiring conductor film, or by a chemical vapor deposition (CVD) method.

A wiring conductor film having a rather good coverage is formed by a CVD method. For example, when using tungsten (W) as a high fusing point metal, $WF_6$ is used as a source gas. A tungsten (W) film is then obtained through a reaction of $WF_6+3H_2\rightarrow W+6HF$,. There arises a problem that HF generated by the reaction will damage a semiconductor substrate. Because the HF, however, will not render a large damage to the through hole or the first wiring conductor film, a CVD method could be utilized.

Further, a semiconductor device of the present invention comprises a semiconductor substrate; a first insulator film formed on the semiconductor substrate; a first wiring conductor film having a bamboo structure disposed on the first insulator film for interconnection, electrically connected to the semiconductor substrate through contact holes, having a specific resistance of $5\sim150$ $\mu\Omega$cm and an allowable current density of $1\times10^6$ to $1\times10^8$ A/cm$^2$; a second insulator film formed on the first wiring conductor film; a plug composed of a high fusing point and low resistance material filling a through hole made in the second insulator film with substantially the same thickness as the second insulator film, electrically connected to the first wiring conductor film; and a second wiring conductor film disposed on the second insulator film and the pug for interconnection, electrically connected to the plug, having a laminated layer structure of at least a high fusing point and low resistance material layer and an Al based alloy layer.

A semiconductor device of the present invention comprises a semiconductor substrate; a first insulator film formed on the semiconductor substrate; a first wiring conductor film disposed on the first insulator film for interconnection, electrically connected to the semiconductor substrate through a contact hole, having a specific resistance of $5\sim150$ cm and an allowable current density of $1\times10^6$ A/cm$^2$ to $1\times10^8$ A/cm$^2$; a second insulator film formed on the first wiring conductor film; a plug composed of a high fusing point and low resistance material filling a through hole made in the second insulator film with substantially the same thickness as the second insulator film, electrically connected to the first wiring conductor film; and a second wiring conductor film disposed on the second insulator film and the plug for interconnection, electrically connected to the plug, having a laminated layer structure of at least a layer of a high fusing point and low resistance material and an Al based alloy layer wherein more than two kinds of materials are concurrently precipitated at grain boundaries.

A semiconductor device of the present invention comprises a semiconductor substrate; a first insulator film formed on the semiconductor substrate; a first wiring conductor film disposed on the first insulator film for interconnection, electrically connected to the substrate through a contact hole, having a specific resistance of $5\sim150$ $\mu\Omega$cm and an allowable current density of $1\times10^6\sim1\times10^8$ A/cm$^2$; a second insulator film formed on the first wiring conductor film; a plug composed of a high fusing point and low resistance material filling a through hole made in the second insulator film with substantially the same thickness as the second insulator film and electrically connected to the first wiring conductor film; and a second wiring conductor film disposed on the second insulator film and the plug, electrically connected to the plug, having at least a two layered structure of a layer formed of a material having a specific resistance of $5\sim150$ $\mu\Omega$cm and a layer formed of a material having a specific resistance of 2 to 5 $\mu\Omega$cm.

A semiconductor device of the present invention comprises a semiconductor substrate; a first insulator film formed on the semiconductor substrate; a first wiring conductor film disposed on the first insulator film for interconnection, electrically connected to the substrate through a contact hole, having a specific resistance of $5\sim150$ $\mu\Omega$cm and formed of a high fusing point material; a second insulator film formed on the first wiring conductor film; a plug composed of a high fusing point and low resistance material with a specific resistance of $5\sim15$ $\mu\Omega$cm filling a through hole formed on the second insulator film with substantially the same thickness as the second insulator film; and a second wiring conductor film having a low resistance and high current density, disposed on the second insulator film and the plug for interconnection, electrically connected to the plug, having at least a two layered structure of a layer formed of a high fusing point material having a specific resistance of $5\sim150$ $\mu\Omega$cm and of a layer formed of an alloy containing aluminum as a major constituent and having a specific resistance of $2\sim50$ $\mu\Omega$cm and an allowable current density of $1\times10^4\sim1\times10^6$ A/cm$^2$.

A semiconductor device of the present invention comprises a semiconductor substrate including silicon (Si) as a major constituent; a first insulator film formed on the semiconductor substrate; a first wiring conductor film composed of one of a titanium nitride (TiN), tungsten (W) and molybdenum (Mo) disposed on the first insulator film for interconnection, electrically connected to the semiconductor substrate through a contact hole; a second insulator film formed on the first wiring conductor film; a plug composed of tungsten (W) or molybdenum (Mo) filling a through hole made in the second insulator film with substantially the same thickness as the second insulator layer, electrically connected to the first wiring conductor film; and a second wiring conductor film disposed on the second insulator film and the plug, electrically connected to the plug, having at least a two layered structure composed of a layer formed of titanium nitride (TiN), tungsten (W), or molybdenum, and a layer containing, aluminum (Al), palladium (Pd) and silicon (Si), and further containing at least one of niobium (Nb), chromium (Cr), zirconium (Zr), molybdenum (Mo), magnesium (Mg) and tantalum (Ta) by $0.01\sim5$ weight percent.

A semiconductor device of the present invention comprises, a semiconductor substrate including silicon as a major constituent; a first insulator film overlaying the semiconductor substrate; a first wiring conductor film disposed on the first insulator film for interconnection, electrically connected to the semiconductor substrate through contact hole, having at least a two layered structure composed of a layer formed of titanium nitride (TiN), tungsten (W), or molybdenum, and a layer containing, aluminum (Al), palladium (Pd) and silicon (Si), and further containing at least one of niobium (Nb), chromium (Cr), zirconium (Zr), molybdenum (Mo), magnesium (Mg) and tantalum (Ta), in $0.01\sim5$ weight percent; a second insulator film formed on the first wiring conductor film; a plug composed of tungsten (W) or molybdenum (Mo) filling a through hole formed in the second insulator film with substantially the same thickness as the second insulator film, electrically connected to the first wiring conductor film; and a second wiring conductor film disposed on the second insulator film and the plug for interconnection, electrically connected to the plug, having at least a two layered structure composed of a layer formed of titanium nitride (TiN), tungsten (W) or molybdenum (Mo) and a mating layer including aluminum (Al), palladium (Pd) and silicon (Si), and further containing at least one of niobium (Nb), chromium (Cr), zirconium (Zr), molybdenum (Mo), magnesium (Mg) and tantalum (Ta) in 0.01 to 5 weight percent.

A semiconductor device of the present invention comprises a semiconductor substrate; a first insulator film formed on the semiconductor substrate; a barrier composed of titanium nitride (TiN) filling in a contact hole formed on the first insulator film in a thickness less than the film thickness, electrically connected to the semiconductor substrate; a first wiring conductor film formed of one of tungsten (W) or molybdenum (Mo) disposed on the first insulator film for interconnection, electrically connected to the barrier; a second insulator film formed on the first wiring conductor; a plug composed of one of tungsten (W) and molybdenum (Mo) filling a through hole formed in the second insulator film with substantially the same thickness as the second insulator film, electrically connected to the first wiring conductor film; and a second wiring conductor film disposed on the second insulator film and the plug for interconnection, connected to the plug, having at least a two layered structure composed of a layer of titanium nitride (TiN), tungsten (W) and molybdenum (Mo), and a mating layer containing aluminum (Al), palladium (Pd) and silicon (Si), and further containing at least one of niobium (Nb), chromium (Cr), zirconium (Zr), molybdenum (Mo), magnesium (Mg) and tantalum (Ta) in 0.01~5 weight %.

In the following, the specific resistance and allowable current density are indicated specifically. For example, in an Al-0.5% Cu-1% Si, its specific resistance is less than 3.5 $\mu\Omega$cm, and its allowable current density less than $5 \times 10^5$ A/cm$^2$. In an Al-1% Si, its specific resistance is less than 3.2 $\mu\Omega$cm, and its allowable current density less than $1 \times 10^5$ A/cm$^2$. Aluminum itself has a specific resistance of about 3.0 $\mu\Omega$cm, and an allowable current density of about $5 \times 10^4$ A/cm$^2$.

Therefore, when tungsten (W) is used as a low resistance and high fusing point material, an aluminum based alloy having a lower specific resistance than tungsten (W). (about 15 $\mu\Omega$cm), can be used as a second wiring conductor film for a semiconductor device of the present invention. That is, Al based alloys of any kind having a lower specific resistance than that of a low resistance and high fusing point material other than W, may be employed.

Further in a semiconductor device of the present invention, a first wiring conductor film and a second wiring conductor film are described to be included, however, the present invention also includes such laminated layer structures in which wiring conductor films having the same constitution as the second wiring conductor film are laminated as a third wiring conductor film and a fourth wiring conductor film.

A contact hole is a portion where a semiconductor substrate and a wiring conductor film contact. In a semiconductor device fabricated by using 0.5 $\mu$m process technology, a diameter and a height of a contact hole are approximately 0.5 $\mu$m and 1 $\mu$m respectively. A ratio of height to diameter (height/diameter) of the contact hole is called aspect ratio. In this example, an aspect ratio is about 2. In considering the manufacturing process, the diameter and height of a contact hole will be approximately 0.6 $\mu$m and 0.9 $\mu$m respectively. A through hole is a portion where a wiring conductor film contacts with another wiring conductor film.

Further in particular, the first wiring conductor film is preferably formed of columnal crystallizations or may be of a bamboo-structure.

More than two type of deposits are preferably precipitated concurrently at the grain boundaries of an aluminum-based alloy.

It is also preferable to interpose an oxide film in a boundary between the low resistance high fusing point metal and the aluminum based alloy layer.

In case, the wiring conductor film is formed of a low resistance and high fusing point metal and an aluminum based alloy, it is preferable that an average diameter of grains of an aluminum based alloy be more than 60% of a wiring conductor width.

In addition, it is preferable to interpose a titanium tungsten (TiW) layer between the low resistance high fusing point metal and the aluminum based alloy, because this enhances an effect of barrier layer of the high fusing point metal.

Furthermore, a semiconductor device manufactured by less than 0.5 $\mu$m process technologies of the present invention, is found to have a resistance increase rate less than 120% for the wiring conductor film even after subjecting continuously to a large current of a density more than $5 \times 10^5$ A/cm$^2$ for ten years.

Also after a current conduction for 100 hours of a large current density over $5 \times 10^5$ A/cm$^2$ at a temperature condition of 200° C., a rate of resistance increase of the wiring conductor film is found to be below 120%.

The data for ten years have been calculated proportionally using the following formula and under an accelerated test condition.

$$\frac{1}{\text{wiring conductor life time}} \alpha \ I^n \cdot \exp\left(-\frac{Q}{RT}\right)$$

where, I is a current density, Q is an activation energy, R is a gas constant, T is the absolute temperature, and n is a constant.

The calculated rate of resistance increase of the wiring conductor film being 120% indicates that the resistance after subjecting to a current conduction becomes 1.2 times that before the current conduction. On the other hand, the life time of the wiring conductor shows a time for the rate of resistance increase to reach 120%.

Further, in the semiconductor device of the present invention, a surface irregularity of the wiring conductor film is less than 0.2 $\mu$m, and preferably less than 0.1 $\mu$m. In view of the specific resistance of the wiring conductor film, a coverage of the contact hole is preferably more than 50%.

Besides, the specific resistance of the first wiring conductor film is preferably less than 15 $\mu\Omega$cm, and that of the second wiring conductor film is preferably less than 6 $\mu\Omega$cm. It is because, in a high speed SRAM etc. a large current is considered to flow through the second wiring conductor film and wiring conductor films thereabove.

By means of these semiconductor devices, a higher electromigration resistance property than those obtained by conventionally used an Al-Si/TiW, an Al-Cu-Si/MoSi$_2$, etc., has been realized and an object to prevent the wiring conductor film from disconnecting is accomplished. Moreover, a semiconductor device is realized of which the wiring conductor film resistance will hardly increase even after subjecting to a large current of more than $5 \times 10^5$ A/cm$^2$.

An IC package of the present invention comprises a lead-frame mounting a semiconductor device, a wire electrically connecting a wiring conductor film on the top of the semiconductor device with the lead-frame, and an sealing material for sealing the peripheries of the semiconductor device and the wire.

Moreover, a sputtering target which is used for depositing an Al base alloy by means of sputtering, is characterized in that the same is composed of an alloy which contains Al, Pd and Si, and one of niobium (Nb), chromium (Cr), zirconium (Zr), molybdenum (Mo), magnesium (Mg) or tantalum (Ta) in 0.01~5 weight %.

The semiconductor device of the present invention is applicable to a dynamic RAM having a memory capacity more than 4 M bits, a static RAM having a memory capacity more than 1 M bits, etc.

With regard to functions of barrier layer in the laminated wiring conductor, boundary conditions between the Al alloy and the barrier layer in the laminated layer wiring conductor are extremely important. That is to say, when a reaction with Al occurs, the resistance of the wiring conductor film increases and the electromigration resistance of the same decreases.

In a laminated wiring conductor film with a MoSi barrier layer and an Al alloy, when annealed at a temperature of 450° C., the reaction greatly proceeds and the resistance of the wiring conductor film greatly increases.

Meanwhile, in the laminated wiring conductor film with the TiW barrier layer and the Al alloy, due to the existence of Ti, the reaction also proceeds and the resistance of the wiring conductor film increases.

It is found that in a laminated wiring conductor film having W, etc. and the Al alloy, a reaction hardly proceeds, therefore little compounds are produced on the boundary between W etc. and an Al alloy, thus, the boundary thickness is kept less than 100Å. Mo in particular does not react with the Al alloy. This is because a strong thin oxide film is formed thereon. Because of no reaction, the resistance of the wiring conductor film does not increase, and moreover because of the existence of the oxide film on the boundary, Al does not migrate. The oxide film thickness is preferably less than 50Å. Therefore, even when a large current is conducted therethrough, disconnection of the film does not occur.

Meanwhile, in order to prevent an increase in resistance of a wiring conductor film even after a large current conduction, it is required that an electromigration resistance of Al alloy itself be enhanced. For this purpose, it is required to strengthen crystalline grain boundaries thereof. For example, it was confirmed in the Al-Pd-Nb-Si alloy that Al$_3$Nb or AlNb and Al$_4$Pd precipitating concurrently at the grain boundaries help strengthen the grain boundaries more than two times than those in which only Al$_4$Pd was precipitated. This is more than four times greater than those where an Al-Cu alloy is used.

That is to say, with the laminated wiring conductor film formed of an Al-Pd-Nb-Si alloy and W, etc., a comparatively higher electromigration resistance property than those of an Al-Cu alloy/MoSi and an Al-Si alloy/TiW is obtainable.

Further, because Pd is added to the above mentioned Al-Pd-Nb-Si alloy, side-etching is prevented during microscopic processing, and a sufficient patterning property below 0.6 μm is obtained.

Alloys other than the Al-Pd-Nb-Si alloy which show high electromigration resistance properties are such as Al-Pd-Cr-Si, Al-Pd-Zr-Si, Al-Pd-Mo-Si, Al-Pd-Mg-Si, and Al-Pd-Ta-Si, Al-Pd-Nb, Al-Pd-Cr, Al-Pd-Zr, Al-Pd-Mo, Al-Pd-Mg and Al-Pd-Ta.

By means of the present invention, a higher electromigration resistance property than those of the conventional Al-Si alloy/TiW, Al-Cu-Si alloy/MoSi$_2$, etc. is obtained and a disconnection of the wiring conductor film is prevented.

Further, by means of the present invention, a semiconductor device is provided in which a wiring conductor film resistance due to electromigration hardly increases even after a large current more than $5 \times 10^5$ A/cm$^2$ is conducted.

DETAILED DESCRIPTION OF THE PREFERRED EMBODIMENTS

Hereinafter embodiments are explained with reference to the drawings.

Figure 1:
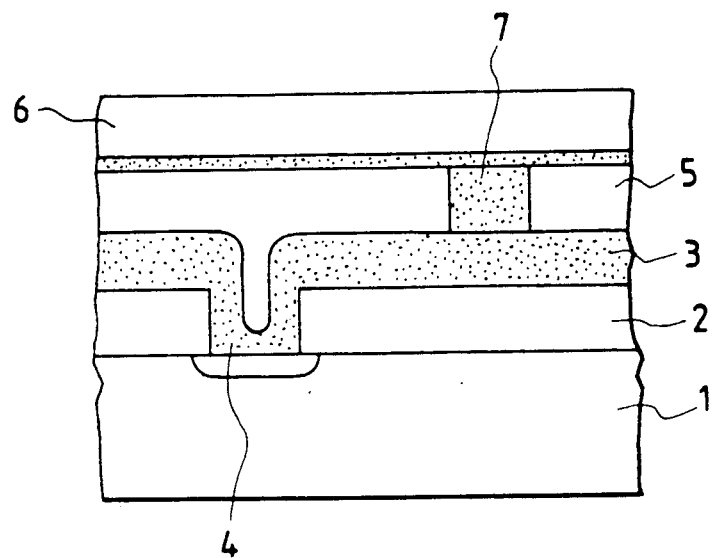
FIG. 1 and FIG. 2 are schematic cross-sectional views of semiconductor devices of the present invention.

FIG. 1 is a schematic cross-sectional view of a semiconductor device of the present invention.

On a semiconductor substrate 1, is formed a first insulator film 2. A first wiring conductor film 3 formed on the first insulator film 2 is contacted to the semiconductor substrate 1 through a contact hole 4. Further, on the first wiring conductor film 3, is formed a second insulator film 5. A second wiring conductor film 6 formed on the second insulator film 5 has a two layered structure, and is contacted to the first wiring conductor film 3 through a through hole 7.

The semiconductor substrate 1 composed of silicon (Si), therein impurities are partially doped. The first wiring conductor film 3 is a W film which was formed by means of sputtering, and the coverage of the W film over the contact hole 4 was about 50%. Further, the through hole 7 was formed by a CVD method using W. The through hole may be formed by a sputtering method, however, because the through hole formation is not on the Si substrate, thus effecting no damage on the same, a CVD method can also be used. The first layer of the second wiring conductor film 6 was composed of Mo, and the second layer was composed of an Al-Pd-Nb-Si alloy.

Thereby, a semiconductor device is realized which enables to conduct such a large current having a current density gas large as $5 \times 10^5$ A/cm$^2$ without causing electromigration.

Figure 2:
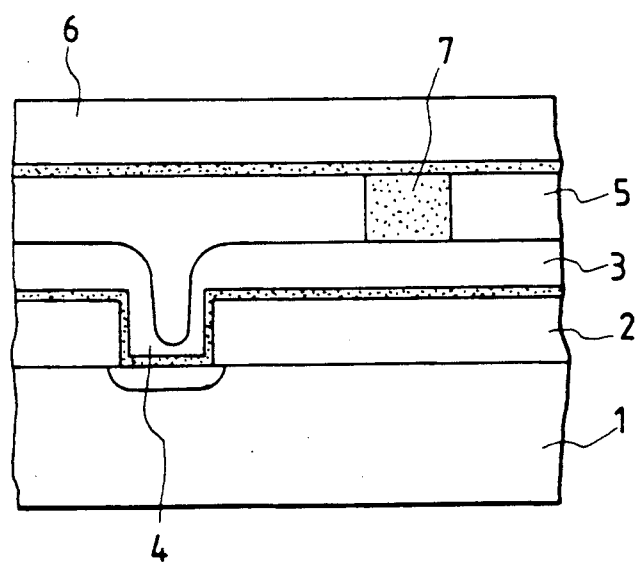

FIG. 2 shows a schematic cross-sectional view of another semiconductor device of the present invention.

On a semiconductor substrate 1, a first insulator film 2 is formed. A first wiring conductor film 3 formed on the first insulator film 2 has a two layered structure and is contacted to the semiconductor substrate 1 through a contact hole 4. The first layer of the first wiring conductor film 3 was formed of Mo and the second layer was formed of an Al-Pd-Nb-Si alloy. Further, on the first wiring conductor film 3 is formed a second insulator film 5. A second wiring conductor film 6 formed on the second insulator film 5 has also a two layered structure, and is connected to the first wiring conductor film 3 through a through hole 7. The second conductor film 6 was formed similarly as the first wiring conductor film 3.

Thereby, because both the first wiring conductor film 3 and the second wiring conductor film 6 have specific resistances as small as $4 \sim 50$ $\mu\Omega$cm, the same are applicable to a semiconductor device requiring a high speed access operation. Absorption of Si into an Al alloy are also prevented.

Moreover, by thus film structure of the present embodiment, DRAMs with more than 16 M bits and SRAMs with more than 4 M bits are able to be accomplished.

Many type of wiring conductor films other than the semiconductor device having the wiring conductor film structure in FIG. 1 and FIG. 2 are able to be accomplished.

For example, a wiring conductor film is formed by depositing a high fusing point metal onto an Al alloy. Thereby oxidization of the Al alloy is prevented, flatness is further enhanced and dry-etching is also improved.

Furthermore, it is preferable that the wiring conductor film has a laminated layer structure composed of TiW, a high fusing point metal and an Al-Cu alloy. By interposing a high fusing point metal between TiW and an Al-Cu alloy, production of reaction compounds from Ti and Cu are suppressed, and for example, when Si is used for the semiconductor substrate, absorbing up Si into the Al-Cu alloy is suppressed.

Besides, it is also preferable to deposit a high fusing point metal on polysilicon, then to overlay thus deposited high fusing point metal with an Al alloy.

Figure 3:
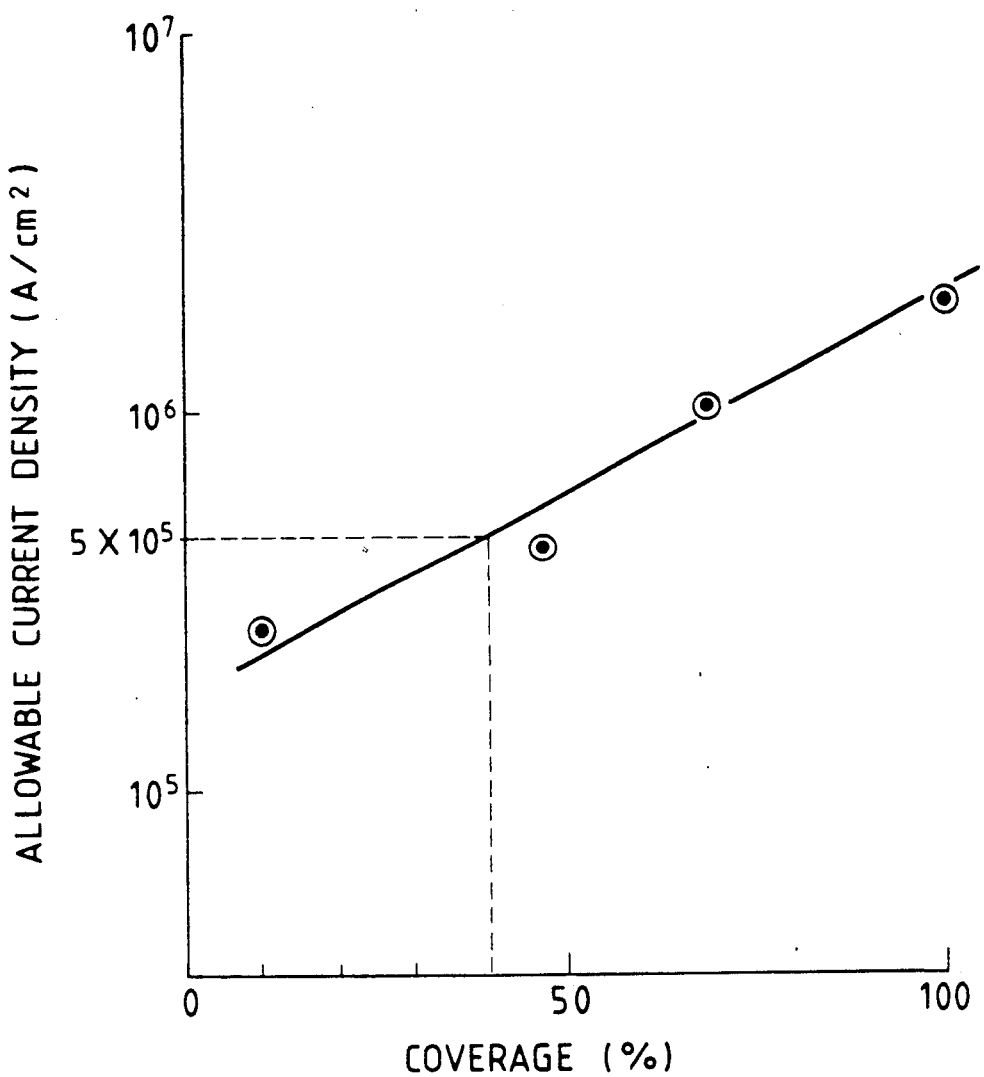
FIG. 3 is a graph which shows coverage change v. allowable current density.

On a semiconductor (Si) substrate, Al is deposited, and further TiAl$_3$ or MoAl$_{12}$ is deposited thereon. Further, it is preferable that W, Mo or TiN is deposited and thereon Al is deposited to form a wiring conductor film. Thereby, adhesion between the first Al and the second Al is enhanced and as well absorption of Si into the second Al is prevented. FIG. 3 shows the result of evaluation of electromigration resistance properties obtained using contact holes having a diameter of 0.5 $\mu$m, a height of 1.0 $\mu$m and an aspect ratio of 2.0, and forming a W or Mo film thereon as well as changing the coverage.

Figure 4:
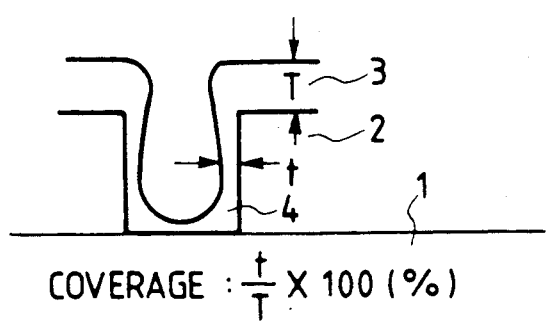
FIG. 4 is a view for explaining the coverage.

Electromigration resistance property is represented by an allowable current density. The coverage, as shown in FIG. 4 is represented by a ratio (t/T) or a film thickness (t) of a W or Mo film formed on the side wall of the contact hole to a film thickness (T) of the same film formed on the insulator film 2. Here, the numeral 1 shows a semiconductor substrate and the numeral 3 shows a wiring conductor film.

As shown in FIG. 3, it is observed that in proportion to an increase in the coverage, the allowable current density increases. Particularly in the embodiment of the present invention, it is apparent that in order to obtain an allowable current density of $5 \times 10^5$ A/cm$^2$, a coverage more than 40% is required.

In FIG. 3, a wiring conductor film with a 100% coverage was formed by means of a CVD method. However, a wiring conductor film formed by a CVD method, has an irregular surface in range of more than 0.2 $\mu$m. Therefore, an insulator film formed thereon and a second wiring conductor film formed on the insulator tend to be influenced by the irregularity, thereby causing problems such as wiring conductor film disconnection.

In case W is used as a wiring conductor film, as W film is formed through reduction of WF$_6$ with H$_2$ in the following reaction,

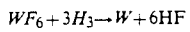

$$WF_6 + 3H_3 \rightarrow W + 6HF$$

the HF produced in the reaction damages a semiconductor substrate.

On the other hand, when a W or Mo film is formed on the above mentioned microscopic contact hole by means of a sputtering method, a damage on the semiconductor substrate is prevented, besides a flat wiring conductor film being provided.

However, by means of conventional sputtering techniques, it was difficult to form a wiring conductor film on microscopic contact holes with a coverage of more than 30%.

Figure 5:
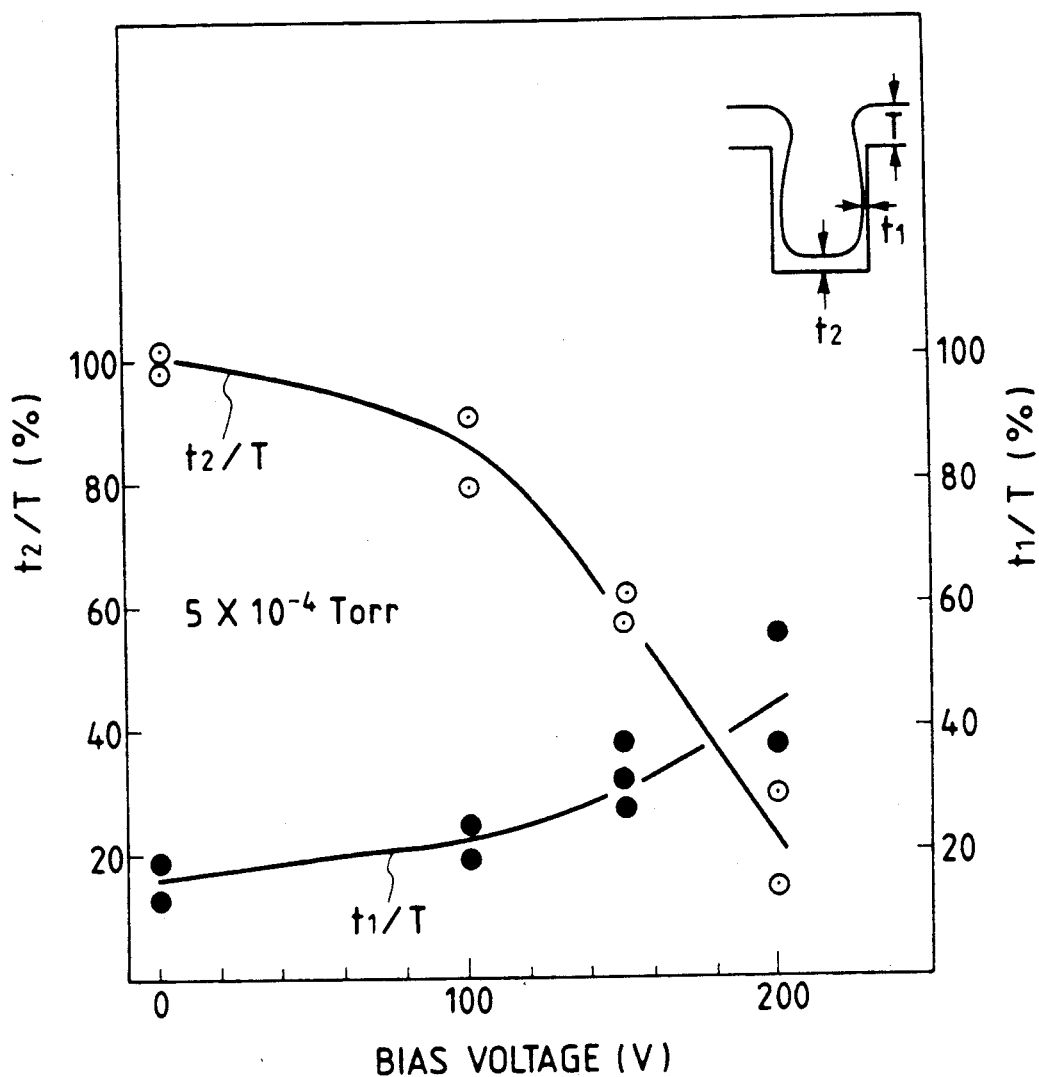
FIG. 5 is a graph which shows bias voltage v. step coverage.

FIG. 5 is a result of investigation of step coverage on the bottom and on the side wall of a contact hole while varying a bias voltage during sputtering.

In sputtering with 0 bias voltage, an adequate stepcoverage is obtained for the bottom, but poor one for the side wall. Namely W is deposited rather well on the bottom, but scarcely on the side wall. In response to an increase in the bias voltage, the coverage on the bottom decreases while that of the side wall increases by means of a resputtering. However, it was found out that by the conventional sputtering techniques, increasing coverages both on the bottom and the side wall by more than 50% preferred in the present invention was difficult.

Moreover, it was observed that a coverage obtained by a sputtering under $10^{-3}$ Torr is about 10% lower than that obtained under $10^{-4}$ Torr.

Figure 6:
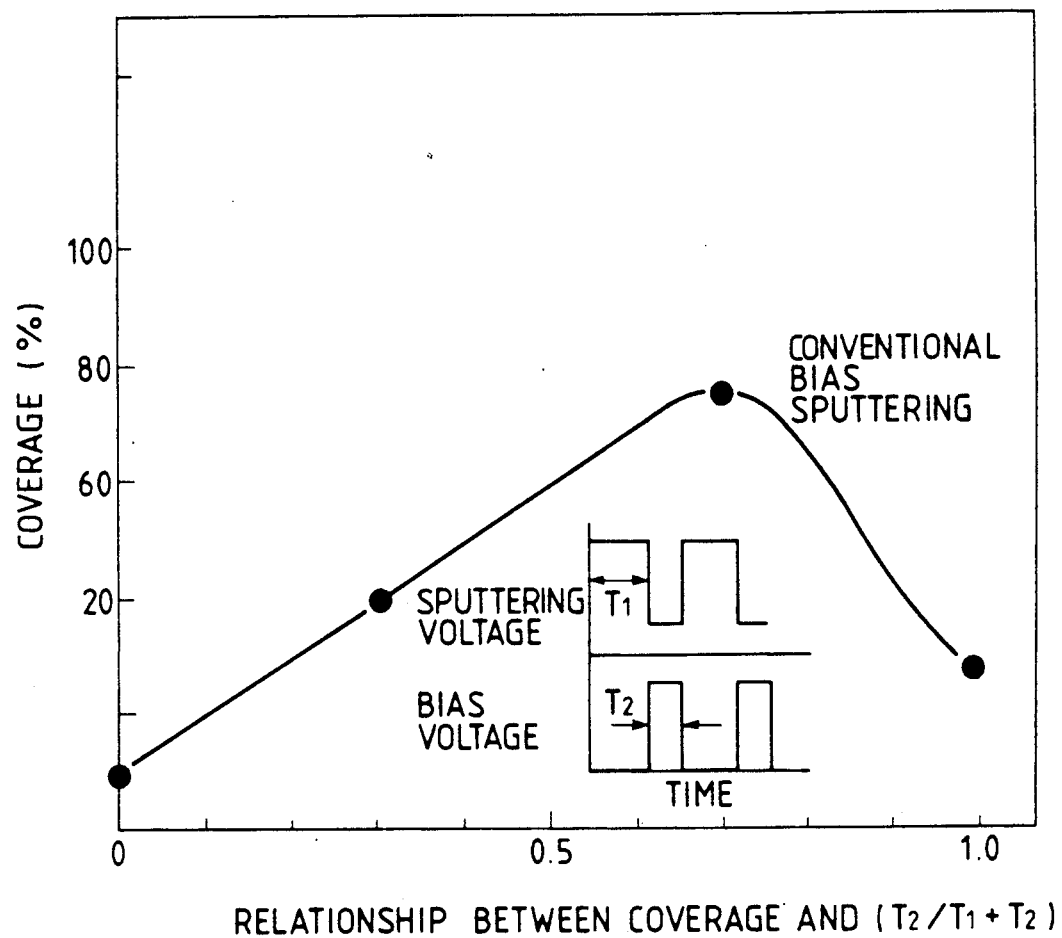
FIG. 6 is a graph which shows bias time ratio v. coverage.

FIG. 6 shows a result of investigation on the coverage of W conducted in consideration of the effect of applying sputter and bias voltages alternatively and varying the bias time ratio.

It was observed that the coverage changed depending upon the bias time ratio. Moreover, as seen in FIG. 6, a coverage more than 50% was achieved when the bias time ratio was $0.4 \sim 0.9$.

In case of Al, when the bias time ratio was 0.3, the coverage became maximum.

The W film formed by means of the above mentioned method has an extremely good adhesion with Si substrate materials and SiO, insulator film. Further, the specific resistance of the wiring conductor film is 11~13 μΩcm which is almost the same as that of the conventional sputtering techniques.

Figure 7:
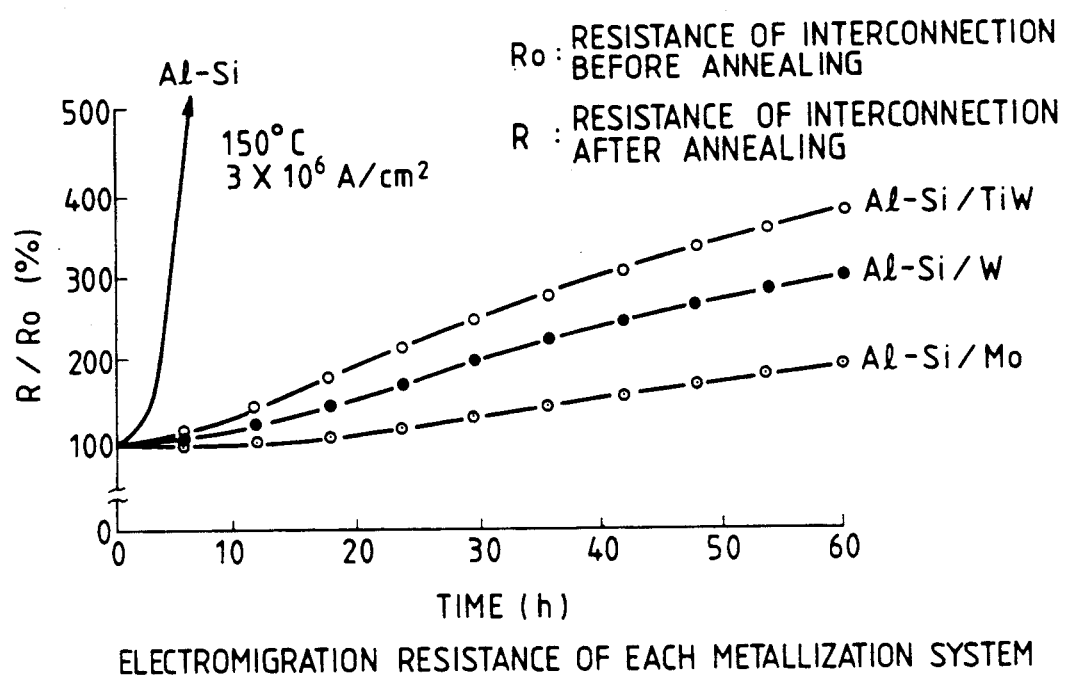
FIG. 7 is a graph showing a relation between electromigration resistance property and resistance increase rate.

FIG. 7 shows results of evaluations of electromigration resistance properties of an Al-Si monolayer film, and of laminated layer films of Al-Si/TiW, Al-Si/W, and Al-Si/Mo.

Here, R shows a wiring conductor film resistance after subjecting to current conduction, and $R_0$ shows that before the current conduction. These evaluations were carried out at 150° C. and at a current density of $3 \times 10^6$ A/cm$^2$.

With regard to the Al-Si monolayer film, it is shown that $R/R_0$ reaches 500% after subjecting to the current conduction for less than 10 hours.

With regard to the laminated films of Al-Si/TiW, Al-Si/W, and Al-Si/Mo, it is shown that their wiring film resistances increase with the increase in a current conduction time. This is because that the current conduction causes Al migration along grain boundaries, thereby introducing slight disconnection in Al film. It also causes a build-up of resistance in a barrier layer of TiW, W or Mo, adding to a total resistance of the wiring conductor film.

Figure 8:
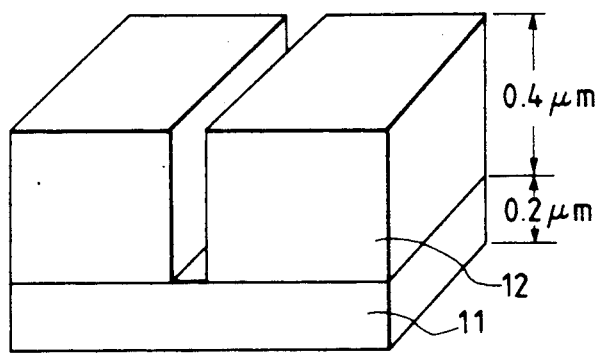
FIG. 8 is a schematic view of a laminated wiring conductor film with a slit cut in the Al wiring conductor film.

FIG. 8 is a schematic view of a laminated wiring conductor film where a slit was generated in the Al wiring conductor film by electromigration. On a barrier layer 11, is formed an Al wiring conductor film 12. The film thickness of the barrier layer 11 was formed in 0.2 μm and that of the Al wiring conductor layer was formed in 0.4 μm.

The calculated results of increases in resistance of wiring conductor films are shown in the next table, where TiW and W are used as materials for the barrier layer 11.

TABLE

|  | TiW | W |
| --- | --- | --- |
| Specific resistance of barrier materials (μΩcm) | 80 | 12 |
| Initial resistance (μΩcm) | 4.4 | 3.9 |
| Resistance under slit generation (μΩcm) | 6.8 | 4.2 |

From the tale, it is clear that resistance increase under slit generation for the W barrier layer is lower than the same for the TiW barrier layer. Therefore, it is obvious that as a barrier layer of an Al wiring conductor film layer, a W film is more suited than a TiW film.

Figure 9:
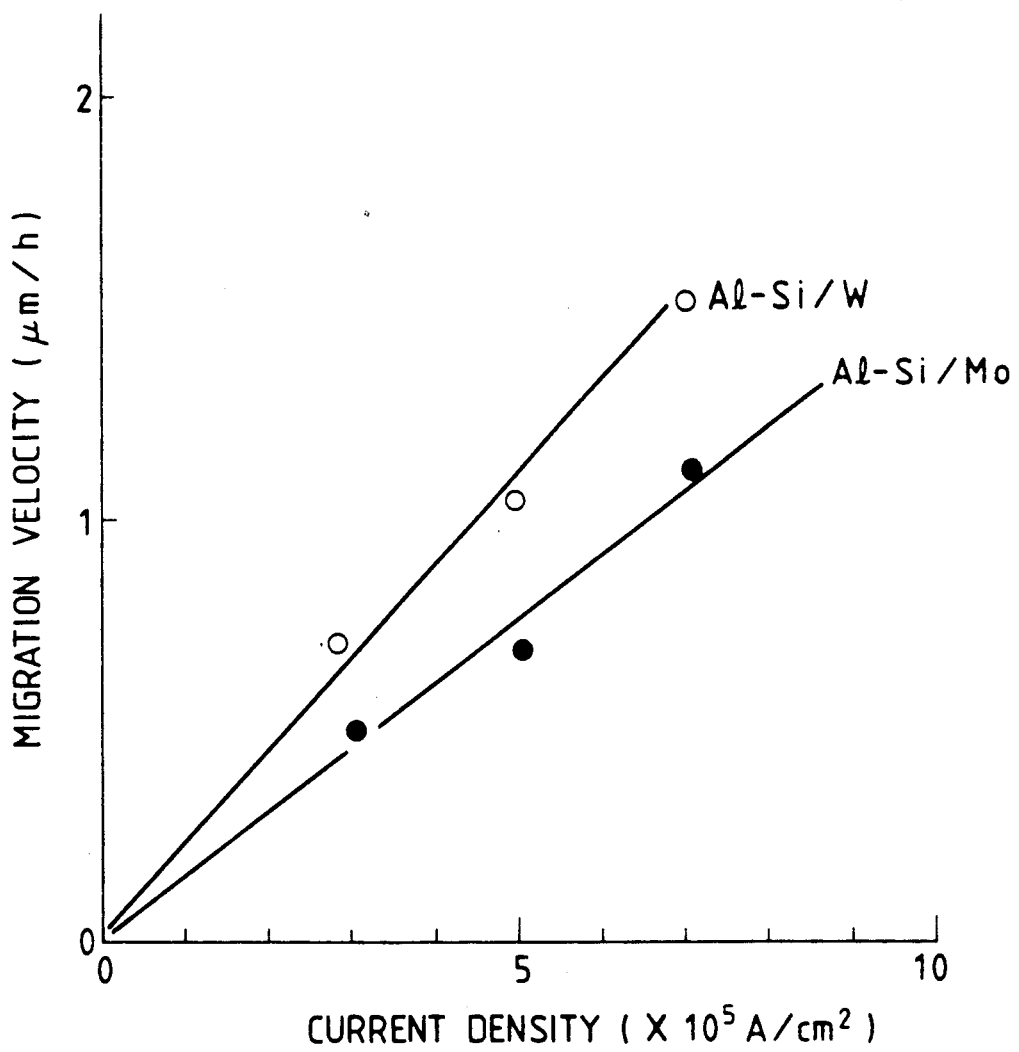
FIG. 9 is a graph showing a relation between current density and migration velocity.

FIG. 9 shows a result of measurements on migration amount in the Al-Si film occurred when currents were flowed through the laminated film of Al-Si/W or Al-Si/Mo respectively.

From FIG. 9, it is obvious that the Al-Si film on the Mo film is harder to migrate than on the W film.

In view of the afore-mentioned results, it is obvious that Mo is most suitable for the barrier layer.

An electric resistance of the laminated wiring conductor film is caused due to Al migration by current conduction and by a slight disconnection at Al grain boundary. Therefore, in order to prevent the wiring conductor film resistance increase, an Al alloy which has a high grain boundary strength is required.

Figure 10:
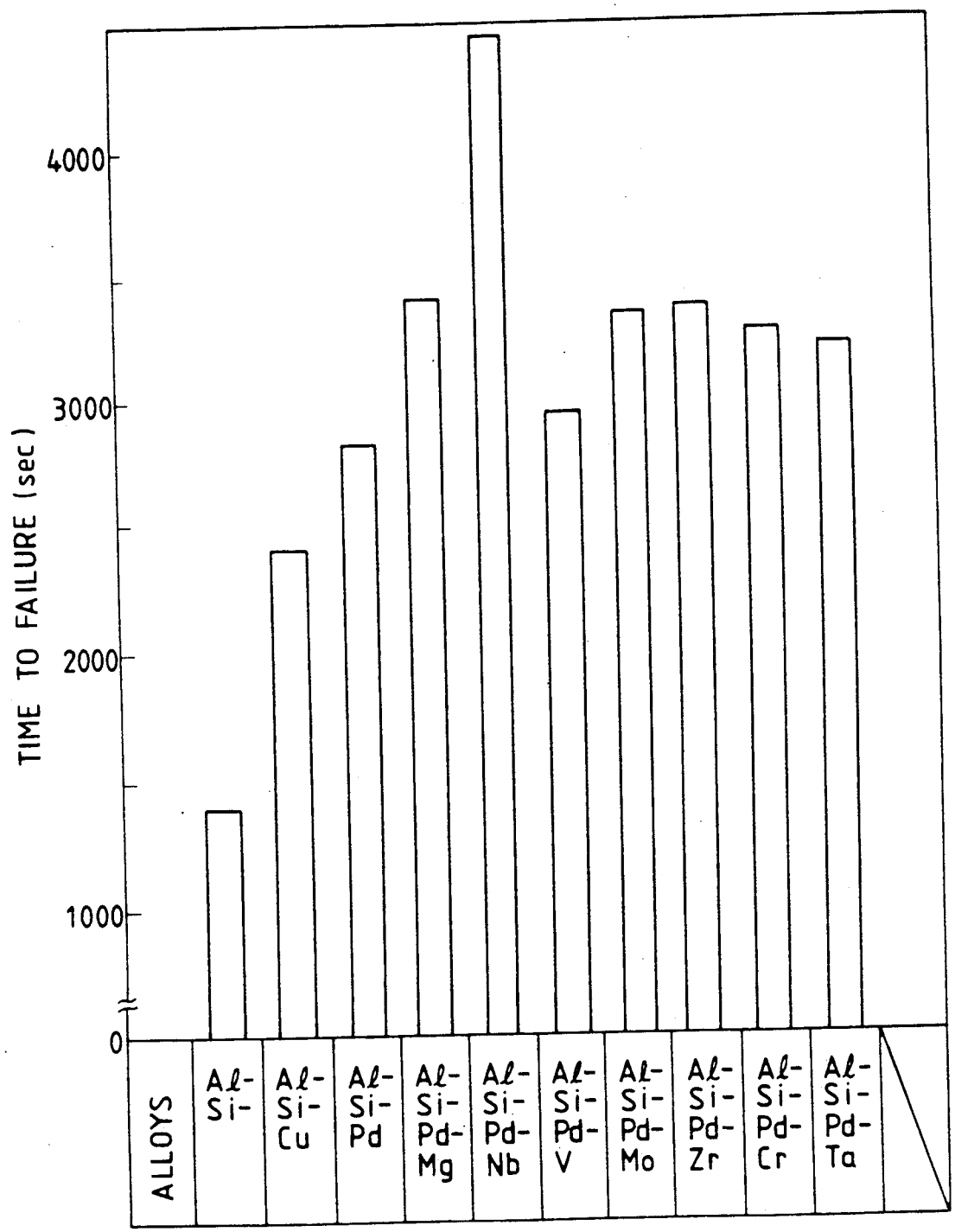
FIG. 10 is a graph showing rupture time of various kinds of Al alloys.

FIG. 10 shows results of an evaluation on the grain boundary strength of several kinds of Al alloys, conducted by using fatigue tests.

In FIG. 10, it is shown that the grain boundary strength of an Al-Pd-Nb-Si alloy is highest, and other alloys such as Al-Pd-Mo-Si, Al-Pd-Zr-Si, Al-Pd-Ta-Si, and Al-Pd-Mg-Si have also good properties in strength.

Figure 11:
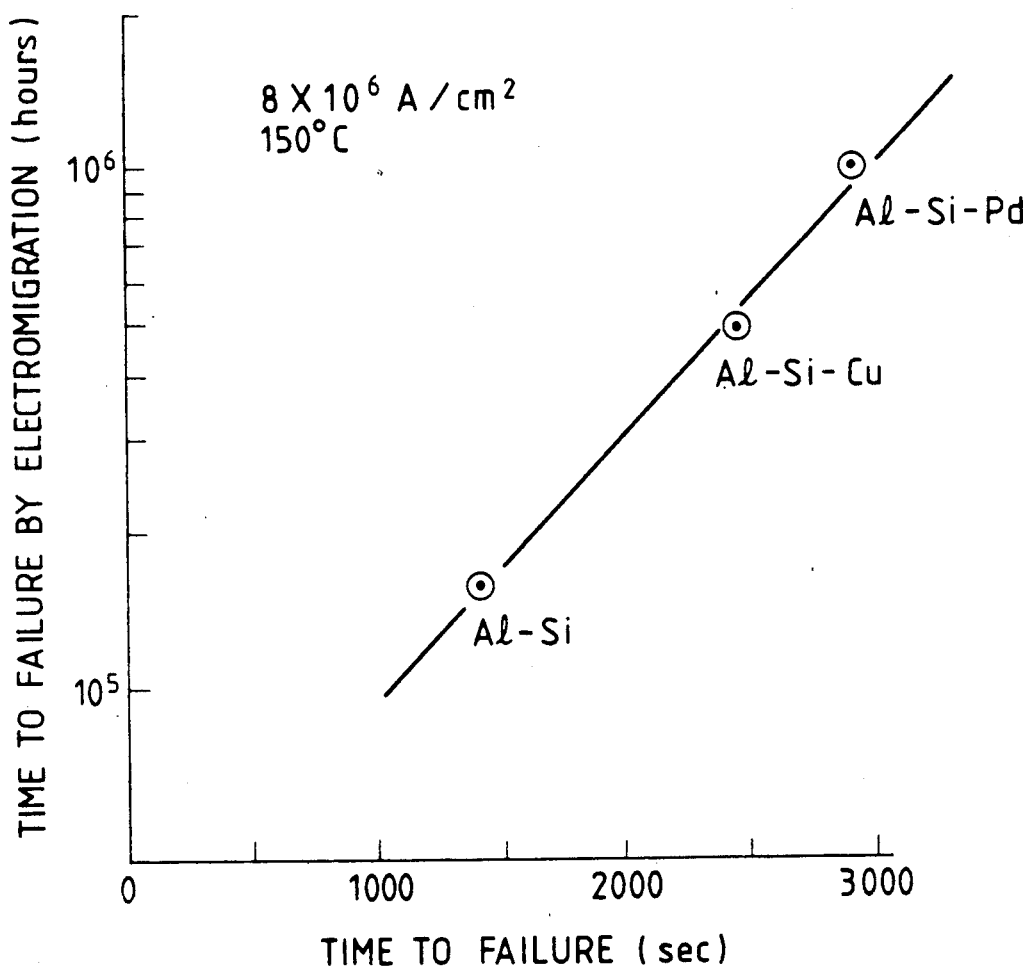
FIG. 11 is a graph showing a relation between rupture time and disconnection time due to electromigration.

FIG. 11 shows a relation between rupture time and film disconnection time caused by electromigration.

From FIG. 11, it is obvious that a material having a long rupture time also has a long time until film disconnection caused by electromigration.

Figure 12:
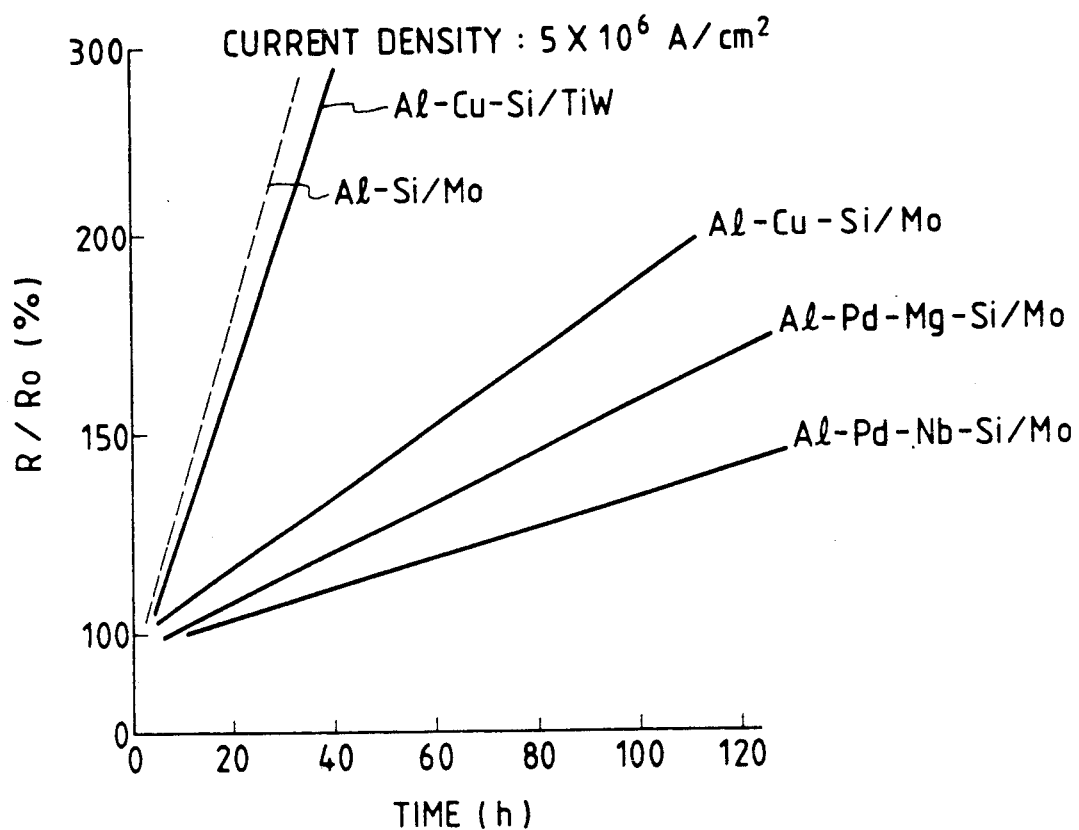
FIG. 12 is a graph showing a comparison and evaluation of a laminated wiring conductor film formed of Al-Pd-Nb-Si/Mo with other Al alloys/Mo films.

FIG. 12 shows results of a comparison of the electromigration resistance property between the laminated wiring conductor film containing an Al-Pd-Nb-Si alloy and Mo, and that of the laminated wiring conductor films containing different Al alloys and Mo.

According to FIG. 12, it is obvious that the electromigration resistance property of the Al-Pd-Nb-Si/Mo wiring conductor film is excellent.

Figure 13:
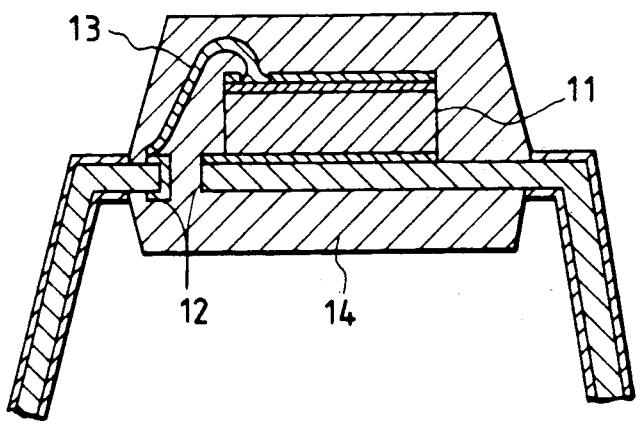
FIG. 13 is a view showing one embodiment of an IC package of the present invention.

FIG. 13 shows an embodiment of an IC package of the present invention.

Numeral 11 shows a semiconductor device wherein a wiring conductor film is formed on a semiconductor substrate. The wiring conductor film has a laminated structure of a layer containing one of W and Mo, and an Al base alloy layer, wherein the wiring conductor film permitting a current density more than $5 \times 10^5$ A/cm$^2$.

Numeral 12 shows a lead frame mounting the substrate, numeral 13 shows a wire electrically connecting between the wiring conductor film and the lead frame, and numeral 14 shows a sealing material for sealing the peripheries of the semiconductor substrate 11 carrying the wiring conductor film, and the wire 13.

The IC package mounting the semiconductor device of the present invention is applicable to a high current density operation.

What is claimed is:

1. A semiconductor device comprising a semiconductor substrate; a first insulator film formed on said semiconductor substrate; a first wiring conductor film disposed on said first insulator film for interconnection and electrically connected to said semiconductor substrate through a contact hole, having a specific resistance of 5~15 μΩcm and an allowable current density of $1 \times 10^6 \sim 1 \times 10^8$ A/cm$^2$; a second insulator film formed on said first wiring conductor film; a plug composed of a refractory and low resistance material filling a through hole formed in said second insulating film with substantially the same thickness as said second insulating film, electrically connected to said first wiring conductor film; and a second wiring conductor film disposed on said second insulation film and said plug for interconnection, electrically connected to said plug, having a laminated layer structure comprising a layer of an electrically conductive material disposed on a layer of a refractory and low resistance material.

2. A semiconductor device comprising a semiconductor substrate; a first insulator film formed on said semiconductor substrate; a first wiring conductor film having a bamboo structure disposed on said first insulator film for interconnection, electrically connected to said semiconductor substrate through a contact hole, having a specific resistance of 5~15 μΩcm and an allowable current density of $1 \times 10^6 \sim 1 \times 10^8$ A/cm$^2$; a second insulator film formed on said first wiring conductor film; a plug composed of a refractory and low resistance material filling a through hole formed in said second insulating film with substantially the same thickness as said second insulating film, electrically connecting to said first wiring conductor film; and a second wiring conductor film disposed on said second insulation film and said plug, electrically connecting to said plug, having a laminated layer structure comprising a layer of an electrically conductive material disposed on a layer of a refractory and low resistance material.

3. A semiconductor device comprising a semiconductor substrate; a first insulator film formed on said semiconductor substrate; a first wiring conductor film disposed on said first insulator film for interconnection, electrically connecting to said semiconductor substrate through a contact hole, having a specific resistance of $5 \sim 15$ $\mu\Omega$cm and an allowable current density of $1 \times 10^6 \sim 1 \times 10^8$ A/cm$^2$; a second insulator film formed on said first wiring conductor film; a plug composed of a high fusing point and low resistance material filling a through hole formed in said second insulating film with substantially the same thickness as said second insulating film, electrically connecting to said first wiring conductor film; and a second wiring conductor film disposed on said second insulation film and said plug for interconnection, electrically connecting to said plug, having a laminated layer structure with at least two layers, including a layer of a high fusing point and low resistance material and a layer of an Al based alloy wherein more than two kinds of microstructures are precipitated at crystalline grain boundaries.

4. A semiconductor device comprising a semiconductor substrate; a first insulator film formed on said semiconductor substrate; a first wiring conductor film disposed on said first insulator film for interconnection, electrically connecting to said semiconductor substrate through a contact hole, having a specific resistance of $5 \sim 15$ $\mu\Omega$cm and an allowable current density of $1 \times 10^6 \sim 1 \times 10^2$; A/cm$^2$; a second insulator film formed on said first wiring conductor film; a plug composed of a high fusing point and low resistance material filling a through hole formed in said second insulating film with substantially the same thickness as said second insulating film, electrically connecting to said first wiring conductor film; and a second wiring conductor film disposed on said second insulation film and the plug for interconnection, electrically connecting to the plug, having a laminated layer structure with at least two layers, including a layer of a material having a specific resistance of $5 \sim 15$ $\mu\Omega$cm and a layer of a material having a specific resistance of $2 \sim 4$ $\mu\Omega$cm.

5. A semiconductor device comprising a semiconductor substrate; a first insulator film formed on said semiconductor substrate; a first wiring conductor film disposed on said first insulator film for interconnection, electrically connecting to said semiconductor substrate through a contact hole, having a specific resistance of $5 \sim 150$ $\mu\Omega$cm and an allowable current density of $1 \times 10^6 \sim 1 \times 10^8$ A/cm$^2$, made of a high fusing point material; a second insulator film formed on said first wiring conductor film; a plug composed of a high fusing point material filling a through hole formed in said second insulating film with substantially the same thickness as said second insulating film, having a specific resistance of $5 \sim 15$ $\mu\Omega$cm; and a low resistance and high current density second wiring conductor film disposed on said second insulation film and said plug for interconnection, electrically connecting to said plug, having a laminated layer structure with at least two layers, including a layer of a high fusing point material having a specific resistance of $5 \sim 15$ $\mu\Omega$cm, and a layer of an Al based alloy having a specific resistance of $2 \sim 4$ $\mu\Omega$cm and an allowable current density of $1 \times 10^4 1 \times 10^6$ A/cm$^2$.

6. A semiconductor device comprising a semiconductor substrate including silicon (Si) as a main constituent; a first insulation film formed on said semiconductor substrate; a first wiring conductor film composed of titanium nitride (TiN), tungsten (W) or molybdenum (Mo) layer disposed on said first insulator film, electrically connecting to said semiconductor substrate; a second insulator film overlaying said first wiring conductor film; a plug composed of tungsten (W) or molybdenum (Mo) filling a through hole formed in said second insulating film with substantially the same thickness as said second insulating film, electrically connecting to said first wiring conductor film; and a second wiring conductor film disposed on said second insulator film and said plug, electrically connecting to said plug, having a laminated layer structure with at least two layers, including a layer containing one of titanium nitride (TiN), tungsten (W) and molybdenum (Mo), and a mating layer containing aluminum (Al), palladium (Pd) and silicon (Si), further one of niobium (Nb), chrome (Cr), zirconium (Zn), molybdenum (Mo), magnesium (Mg) and tantalum (Ta) by $0.01 \sim 5$ weight %.

7. A semiconductor device comprising a semiconductor substrate including silicon (Si) as a main constituent; a first insulator film formed on said substrate; a first wiring conductor film disposed on said first insulator film, electrically connected to said substrate through a contact hole, having a laminated layer structure with at least two layers, including a layer containing one of titanium nitride (TiN), tungsten (W) and molybdenum (Mo), and a mating layer containing aluminum (Al), palladium (Pd) and silicon (Si), and one of niobium (Nb), chrome (Cr), zirconium (Zn), molybdenum (Mo), magnesium (Mg) and (Ta) in $0.01 \sim 5$ weight %; a second insulator film formed on said first wiring conductor film; a plug composed of tungsten (W) or molybdenum (Mo) filling a through hole formed in said second insulating film with substantially the same thickness as said second insulating film, electrically connected to said first wiring conductor film; and a second wiring conductor film disposed on said second insulator film and said plug for interconnection, electrically connected to said plug, having a laminated layer structure with at least two layers, including a layer containing one of titanium nitride (TiN), tungsten (W) and molybdenum (Mo), and a mating layer containing aluminum (Al), palladium (Pd) and silicon (Si), further one of niobium (Nb), chrome (Cr), zirconium (Zr), molybdenum (Mo), magnesium (Mg) and tantalum (Ta) in $0.01 \sim 5$ weight %.

8. A semiconductor device comprising a semiconductor substrate; a first insulator film formed on said substrate; a barrier made of titanium nitride (TiN) overlaying a contact hole formed in said first insulator film with a thickness less than that of said first insulator film, electrically connected to said substrate; a first wiring conductor film disposed on said first insulator film for interconnection, made of tungsten (W) or molybdenum (Mo) electrically connected to said barrier; a second insulator film formed on said first wiring conductor film; a plug composed of tungsten (W) or molybdenum (Mo) filling a through hole formed in said second insulator film with substantially the same thickness as said second insulator film, electrically connecting to said first wiring conductor film; and a second wiring conductor film disposed on said second insulator and said plug for interconnection, electrically connected to said plug, having a laminated layer structure with at least two layers, including of an alloy containing one of titanium nitride (TiN), tungsten (W) and molybdenum (Mo), and a mating layer containing aluminum (Al), palladium (Pd) and silicon (Si), further one of niobium (Nb), chrome (Cr), zirconium (Zn), molybdenum (Mo), magnesium (Mg) and tantalum (Ta) in 0.01~5 weight %.

9. A semiconductor package comprising a lead frame mounting a semiconductor device according to claim 1, wires electrically connecting between the uppermost wiring conductor film on said semiconductor device and said lead frame, and sealing member sealing the peripheries of said semiconductor device and said wires.

10. A semiconductor device according to claim 1, wherein the layer of a conductive material, forming the laminated layer structure, is a layer of aluminum based alloy.

11. A semiconductor device according to claim 2, wherein the layer of a conductive material, forming the laminated layer structure, is a layer of aluminum based alloy.

12. A semiconductor device according to claim 1, wherein the first wiring conductor film is made of a material selected from the group consisting of tungsten, molybdenum and titanium nitride.

13. A semiconductor device according to claim 1, wherein the laminated layer structure includes two layers of refractory and low resistance material sandwiching a layer of aluminum based alloy.

14. A semiconductor device according to claim 1, wherein material of the layer of a conductive material is selected from the group consisting of Al-Pd-Nb-Si, Al-Pd-Cr-Si, Al-Pd-Zr-Si, Al-Pd-Mo-Si, Al-Pd-Mg-Si, Al-Pd-Ta-Si and Al-Pd-Nb.

15. A semiconductor device according to claim 1, wherein the layer of a conductive material is made of an aluminum based alloy, an average diameter of grains of the aluminum based alloy being more than 60% of a width of the second wiring conductor film.

16. A semiconductor device according to claim 1, wherein the layer of a conductive material is made of an aluminum based alloy, and wherein the laminated layer structure further includes a barrier layer of TiW between the layer of refractory and low resistance material and the layer of an aluminum based alloy.

17. A semiconductor device according to claim 1, wherein a specific resistance of the first wiring conductor film is less than 15 $\mu\Omega$cm, and a specific resistance of the second wiring conductor film is less than 6 $\mu\Omega$cm.

18. A semiconductor device according to claim 1, wherein the refractory and low resistance material of which the plug is composed in the same material as that of the layer of refractory and low resistance material of the laminated layer structure.

19. A semiconductor device according to claim 2, wherein the refractory and low resistance material of which the plug is composed is the same material as that of the layer of refractory and low resistance material of the laminated layer structure.

20. A semiconductor device comprising:
a semiconductor substrate;
a first insulator film formed on said semiconductor substrate;
a first wiring conductor film formed on said first insulator film, said first wiring conductor film being electrically connected to said semiconductor substrate through a contact hole;
a second insulator film formed on said first wiring conductor film;
a plug composed of a refractory and low resistance material, filling a through hole formed in said second insulator film; and
a second wiring conductor film formed on said second insulator film and on said plug, said second wiring conductor film being electrically connected to said plug, and having a laminated layer structure comprising a layer of an aluminum based alloy disposed on a layer of a refractory and low resistance material.

* * * * *